(12) United States Patent
Yamauchi et al.

(10) Patent No.: US 8,227,148 B2
(45) Date of Patent: Jul. 24, 2012

(54) HOLOGRAM FABRICATION PROCESS AND FABRICATED HOLOGRAM

(75) Inventors: Tsuyoshi Yamauchi, Tokyo (JP); Kenji Ueda, Tokyo (JP); Masachika Watanabe, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 517 days.

(21) Appl. No.: 12/362,151

(22) Filed: Jan. 29, 2009

(65) Prior Publication Data
US 2009/0197187 A1 Aug. 6, 2009

(30) Foreign Application Priority Data

Feb. 1, 2008 (JP) ................................. 2008-022751
Jan. 20, 2009 (JP) ................................. 2009-009471

(51) Int. Cl.
*G03H 1/02* (2006.01)

(52) U.S. Cl. ...................... 430/1; 430/2; 359/12; 359/35

(58) Field of Classification Search ........................ None
See application file for complete search history.

(56) References Cited

U.S. PATENT DOCUMENTS

| | | | | |
|---|---|---|---|---|
| 3,582,176 A * | 6/1971 | Mathisen | .......................... | 359/33 |
| 3,647,289 A * | 3/1972 | Weber | .............................. | 359/12 |
| 3,993,400 A * | 11/1976 | Leib | ................................. | 385/73 |
| 4,988,151 A * | 1/1991 | Moss | .................................. | 359/9 |
| 5,447,335 A * | 9/1995 | Haslop | ............................. | 283/91 |
| 6,081,354 A * | 6/2000 | Gambogi et al. | ............... | 359/15 |
| 6,127,066 A * | 10/2000 | Ueda et al. | ......................... | 430/1 |
| 6,351,537 B1 * | 2/2002 | Dovgodko et al. | ............. | 380/54 |
| 6,613,481 B2 * | 9/2003 | Hamada | ........................... | 430/1 |
| 6,813,048 B2 * | 11/2004 | Kitamura | .......................... | 359/9 |
| 2003/0016408 A1 * | 1/2003 | Kashiwagi et al. | ............... | 359/2 |
| 2003/0030858 A1 * | 2/2003 | Kodama | ............................ | 359/1 |
| 2004/0076888 A1 * | 4/2004 | Kitamura | .......................... | 430/1 |
| 2004/0121241 A1 * | 6/2004 | Kodama | ............................ | 430/1 |
| 2006/0072178 A1 * | 4/2006 | Takabayashi et al. | .......... | 359/24 |
| 2007/0273146 A1 * | 11/2007 | Davis et al. | .................... | 283/91 |

\* cited by examiner

*Primary Examiner* — Martin Angebranndt
(74) *Attorney, Agent, or Firm* — Sughrue Mion, PLLC

(57) ABSTRACT

The invention provides a hologram in which a visually unidentifiable microtext or other micropattern of the order of 10 μm is recorded, and a process for the fabrication of the same. A volume hologram recording material 2 is located on the side of a reflection type volume hologram master 1 onto which copying illumination light 11 is incident, and the copying illumination light 11 incident onto the recording material 2 and light 12 diffracted through the master 1 interfere together in the volume hologram recording material 2 thereby copying the reflection type volume hologram master. In this case, a reflecting plate 5 having a fine regular reflection pattern 3 is interleaved between the master 1 and the recording material 2, and the copying illumination light 11 incident onto the recording material 2 and regularly reflected light 32 from the reflecting plate having the regular reflection pattern 3 interfere together in the recording material 2 thereby allowing the regular reflection pattern 3 to be multi-recorded in a hologram having the reflection type volume hologram master 1 copied in it.

4 Claims, 5 Drawing Sheets

HOLOGRAM FABRICATION PROCESS AND FABRICATED HOLOGRAM

The present invention relates generally to a hologram fabrication process and a fabricated hologram, and more particularly to a process for the fabrication of a microtext hologram in which a micropattern such as a microtext pattern is recorded in a conventional volume hologram, and which may be used in security hologram applications, and a microtext hologram fabricated by that process.

BACKGROUND ART

So far, a micropattern recorded in the form of a volume hologram has been as fine as about 100 µm. In some relief holograms, micropatterns as fine as about 30 µm have been recorded in the form of holograms.

When a visually unidentifiable pattern such as a microtext pattern was recorded in the prior art, a pattern fabricated with a printing film or the like was used as an object for holographic recording (Patent Publication 1), or a pattern fabricated with a printing film or the like was brought into close contact with a holographic recording material, and the holographic recording material was deactivated in a pattern form to form a hologram pattern (Patent Publication 2).

PRIOR ART

Patent Publications

Patent Publication 1: JP(A)2003-29607
Patent Publication 2: JP(A)11-24538

SUMMARY OF THE INVENTION

Objects of the Invention

So far, a micropattern fabricated with a volume hologram was as fine as about 100 µm, and so it could visually be identified by use of a simple magnifier such as a loupe.

When a relief hologram was used to form a micro-pattern as a photolithographic pattern, it was then possible to form a pattern of as fine as a few µm. However, this hologram was indeed recorded physically, not as any hologram.

On the other hand, when pattern configuration was recorded as a volume hologram in a conventional manner, a transparent substrate such as a film or glass one was inserted between a hologram recording material and the pattern configuration upon holographic recording, and so the pattern configuration had a minimum size of about 100 µm.

Thus, the micropattern to be recorded in and reconstructed out of a conventional volume hologram was not fully fine: it was not always visually unidentifiable, and still far away from satisfaction in view of security.

Having been made with such prior art situations in mind, the invention has for its object to provide a micro-text hologram wherein visually unidentifiable microtext or other micropattern of the order of 10 µm is recorded.

Means for Accomplishing the Object

According to one aspect of the invention, the aforesaid object is accomplishable by the provision of a hologram fabrication process wherein a volume hologram recording material is located on the side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a reflecting plate having a regular reflection zone is interleaved between said reflection type volume hologram master and said volume hologram recording material, and said copying illumination light incident onto said volume hologram recording material and regularly reflected light from the regular reflection zone of the said reflecting plate interfere together in said volume hologram recording material thereby allowing said regular reflection zone to be multi-recorded in a hologram having said reflection type volume hologram master copied in it.

According to another aspect, the invention provides a reflection type volume hologram having any desired object image recorded in a reconstructible mode, characterized in that there is a pattern multi-recorded that comprises interference fringes, at least some of which are lined up substantially parallel with a hologram recording surface, and said pattern is designed such that when white illumination light is incident onto the hologram recording surface vertically from above, a color reconstructed at both ends of the pattern differs from a color reconstructed at the center of the pattern in a specific direction along the recording surface, and the whole pattern is viewed in the same construction color in a direction orthogonal to said specific direction along the recording surface.

Preferably in this case, one side or the diameter of said pattern has a size of up to 50 µm.

It is also preferable that said pattern is recorded in a plurality of areas of the hologram, and a space between said areas is at least 50 times as large as the size of one said pattern.

It is further preferable that said pattern is recorded in an area of up to 1/10,000 relative to the hologram area.

According to yet another aspect, the invention provides a hologram fabrication process wherein a volume hologram recording material is located on the side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a reflecting plate having a regular reflection zone is interleaved between said reflection type volume hologram master and said volume hologram recording material, and another regular reflection zone copying illumination light is incident onto an area of said reflecting plate that has a regular reflection zone substantially vertically to said volume hologram recording material so that said regular reflection zone copying illumination light incident onto said volume hologram recording material and regularly reflected light from the regular reflection zone of said reflecting plate interfere together in said volume hologram recording material thereby allowing said regular reflection zone to be multi-recorded in a hologram having said reflection type volume hologram master copied in it.

According to further aspect, the invention provides a hologram fabrication process wherein a volume hologram recording material is located on the side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a volume hologram recording material separate from said volume hologram recording material is located on a reflecting plate having a regular reflection zone, and regular reflection zone copying illumination light separate from said copying illumination light is incident from said separate volume hologram recording material side onto said separate volume hologram recording material so that said regular reflection zone copying illumination light incident onto said separate volume hologram recording material and regularly reflected light from the regular reflection zone of said reflecting plate interfere together thereby recording said regular reflection zone in said separate volume hologram recording material as a hologram, and thereafter, a hologram having said reflection type volume hologram master copied in said volume hologram recording material and a hologram having said regular reflection zone recorded in said separate volume hologram recording material as the hologram are stacked one upon another.

Further, the invention embraces a reflection type volume hologram having any desired object image recorded in a reconstructible mode, characterized in that there is a pattern multi-recorded that comprises interference fringes, at least some of which are lined up vertically parallel with a hologram recording surface, and one side or a diameter of said pattern has a size of up to 50 μm.

Preferably in this case, one side or the diameter of said pattern has a size of up to 50 μm.

It is also preferable that said pattern is recorded in a plurality of areas of the hologram, and a space between said areas is at least 50 times as large as the size of one said pattern.

It is further preferable that said pattern is recorded in an area of up to 1/10,000 relative to the hologram area.

Advantages of the Invention

With the invention, direct holographic recording is achievable upon hologram copying without repeating the copying of the reflecting plate having a regular reflection zone over and over, so that without rendering resolving power worse, a visually unidentifiable microtext or other micropattern of the order of 10 μm is superposed on a holographically recorded image in a holographically recordable mode, yielding a hologram good enough for use in security applications. In the ensuing hologram, a hologram subject to color shifting at both ends of the pattern and an ordinary hologram are mixed up in a multiple or multilayer form: this feature contributes more to counterfeit resistance.

MODE FOR CARRYING OUT THE INVENTION

The inventive hologram fabrication process and the fabricated hologram are now explained with reference to some examples.

The fundamental principles of the invention are that when a volume hologram master having any desired object image recorded as a reflection type hologram is used to fabricate (copy) a volume hologram similar to that master by a hologram copying process, a pattern plate having a regular reflection pattern of visually unidentifiable microtexts or the like formed on it is interleaved between a volume hologram recording material and the volume hologram master, and superposed and recorded on a hologram copied as a hologram mirror pattern. The regular reflection micropattern is positioned in close contact with the volume hologram recording material or as close to it as possible so that a micropattern of the order of 10 μm can holographically be recorded.

Figure 1:
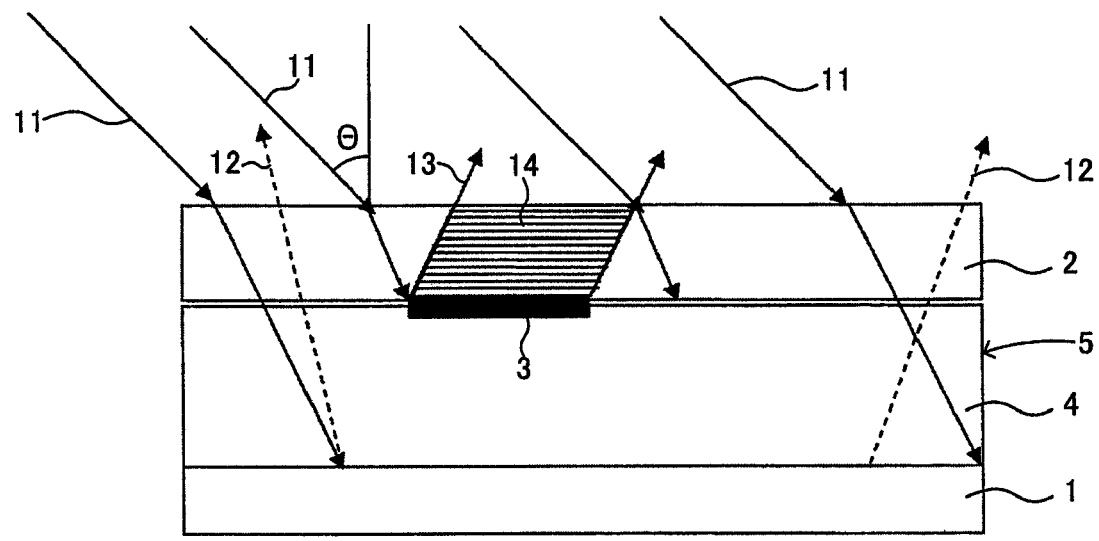
FIG. 1 is illustrative in section of one example of the inventive microtext hologram fabrication process.

FIG. 1 is illustrative in section of one example of the inventive microtext hologram fabrication process. To use a reflection type volume hologram master 1 to fabricate a volume hologram similar to that master by a hologram copying process, a volume hologram recording material 2 such as a photopolymer is located on the side of the volume hologram master 1 onto which copying illumination light 11 is incident. Between the volume hologram master 1 and the volume hologram recording material 2, there is a pattern plate 4 interleaved according to the invention. That pattern plate 4 is made up of a transparent substrate 4 such as a glass sheet and has a visually unidentifiable microtext or other regular reflection micropattern 3—comprising a reflective film of chromium or the like—formed on the surface of the transparent substrate 4 that faces the volume hologram recording material 2. Then, the volume hologram master 1, pattern plate 5 and volume hologram recording material 2 are closely stacked one upon another with or without an index-matching liquid between them. In this state, the copying illumination light 11 is obliquely incident onto the volume hologram recording material 2. The angle of oblique incidence, θ, of the copying illumination light 11 is usually equal to or slightly different from the angle of incidence of reference light in the recording of the volume hologram master 1. The copying illumination light 11 incident onto the volume hologram recording material 2 transmits through the volume hologram recording material 2, and a portion of the copying illumination light 11 transmitting through a transparent area of the pattern plate 5 free of the regular reflection pattern 3 enters the volume hologram master 1 so that diffracted light 12 that reconstructs a recorded object image is generated on the entrance side of the copying illumination light 11. The diffracted light 12 passing through the transparent area of the pattern plate 5 and the incident copying illumination light 11 are allowed to interfere together in the volume hologram recording material 2 to form hologram interference fringes in the volume hologram recording material 2. On the other hand, a portion of the copying illumination light 11 incident onto a reflective area of the pattern plate 5 at which there is the regular reflection pattern 2 is reflected as regularly reflected light 13 while the configuration of the regular reflection pattern 3 is kept intact. Then, that regularly reflected light 13 and the incident copying illumination light 11 are allowed to interfere together in the volume hologram recording material 2, so that interference fringes 14 lined up parallel with the surface of a recording layer of the volume hologram recording material 2 are superposed and formed on the interference fringes for reconstructing the recorded object image on the volume hologram master 1. The area where the interference fringes 14 are formed has the copying illumination light 11 overlapping the oblique, regularly reflected light 13: in a section including the copying illumination light 11 and a normal to the recording layer, it takes on a parallelogram as shown in FIG. 1, and in the section vertical to the plane of FIG. 1, it takes on a rectangle.

Figure 2:
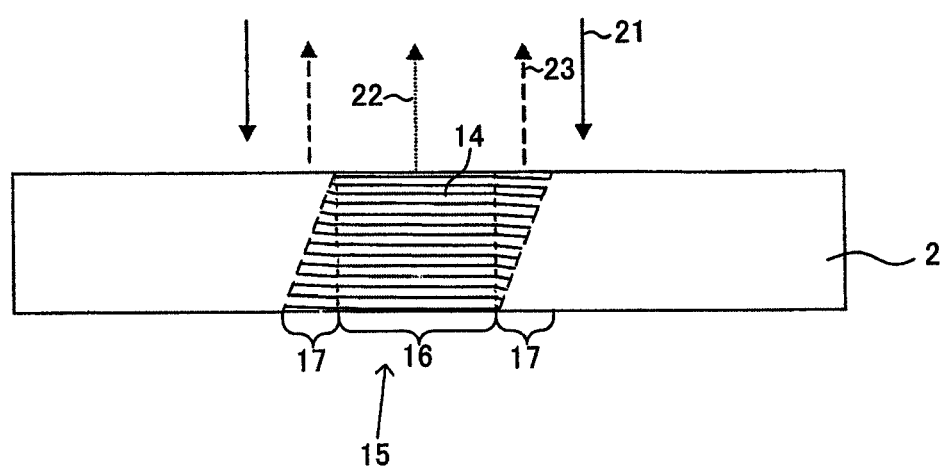
FIG. 2 is illustrative in schematic, as in the same section as that of FIG. 1, of interference fringes formed by regularly reflected light from a regular reflection pattern recorded in a volume hologram recording material.
Figure 3:
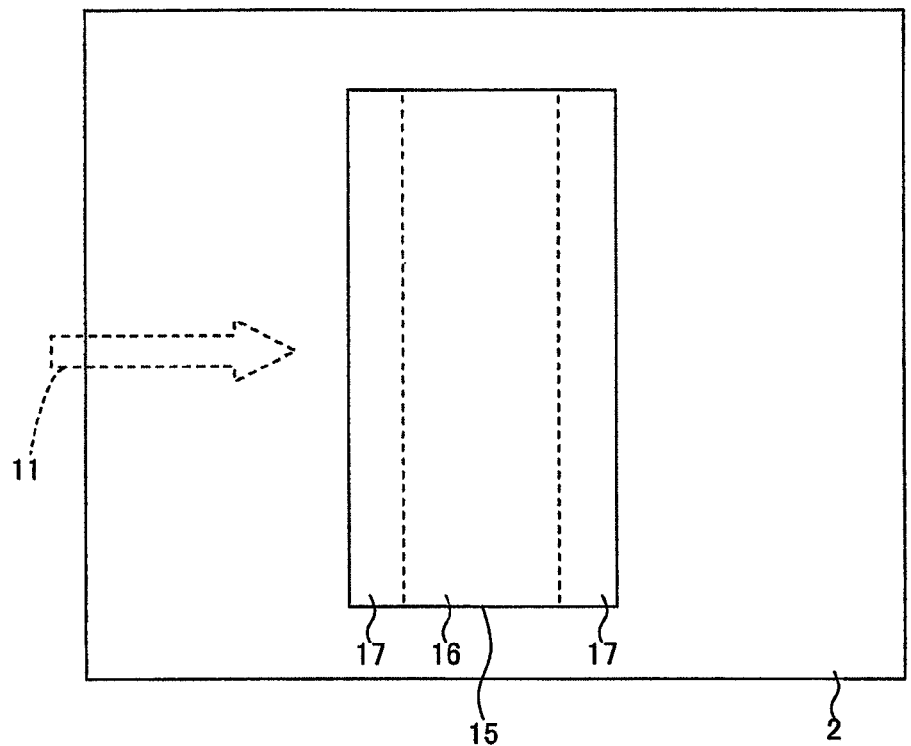
FIG. 3 is a front view of a reconstructed image in the micropattern recorded in FIG. 2.

FIG. 2 is illustrative in schematic, as in the same section as that of FIG. 1, of the interference fringes 14 formed by the regularly reflected light from the regular reflection pattern 13 recorded in the volume hologram recording material 2, and FIG. 3 is a front view of a reconstructed image 15 in the then recorded micropattern. In this case, the reconstructed image 15 in the micropattern is presumed to take on an elongate rectangle orthogonal to the direction of the copying illumination light 11. The interference fringes 14 are superposed and recorded on the interference fringes that reconstruct the recorded object image in the volume hologram master 1, and are lined up parallel with the surface of the recording layer of the volume hologram recording material 2 and at a constant pitch. A set of these interference fringes 14 is also called a hologram mirror; for instance, when there is white illumination light 21 vertically incident from above the volume hologram recording material 2, light having a wavelength corresponding to the pitch of the interference fringes 14 is reflected (diffracted) vertically up from an area having the interference fringes 14 recorded in it, i.e., an area of the same shape as that of the regular reflection pattern 3 on the pattern plate 5. Accordingly, when the regular reflection pattern 3 comprises visually unidentifiable microtexts or the like, such a visually unidentifiable microtext or other pattern 15 is also readable by a microscope or the like from the copied volume hologram (volume hologram recording material 2): it may be used as a hologram in security applications.

The magnitude (resolving power) of the regular reflection pattern 3 is preferably about half the recording wavelength, and more preferably up to 1/10 of the recording wavelength. More practically, it is desired that one side or the diameter of the regular reflection pattern 3 has a size of up to 50 µm.

Referring here to the area having the reference fringes 14 formed on it, in the section (the plane of FIG. 1) including the copying illumination light 11 and the normal to the recording layer as mentioned above, it takes on a parallelogram as shown: it is built up of an area 16 where the interference fringes are lined up parallel with the surface of the recording layer from the front to the back surface of the recording layer of the volume hologram recording material 2, and an area 17 at either end of it where the interference fringes become gradually short from top to bottom, and vice versa. In the area 17 on either end of the area 16, there is none of the interference fringes recorded on the front or back surface side of the recording layer, and so the pitch of the ends of the interference fringes 14 grows a bit wider for the reasons of diffusion of the monomer or the like from the periphery free of recording. For instance, consider now that the white illumination light 21 is incident onto the area of the interference fringes 13 vertically from above the volume hologram recording material 2. Here, if, for instance, light 22 having a green wavelength is reflected off the area 16, then light having a bit longer wavelength than that, for instance, orange light 23 will be reflected off the area 17. That is, in the section including the copying illumination light 11 and the normal to the recording layer, there will be the pattern recorded wherein both ends are viewed in reconstruction colors that are different from those of the center and have a longer wavelength. In the direction vertical to the section including the copying illumination light 11 and the normal to the recording layer, the area having the interference fringes 14 formed on it takes on a rectangular shape in section; it has none of the ends of such a sectional area 17 as shown in FIG. 2. Accordingly, as can be seen from FIG. 3, there is the pattern recorded such that in the direction of the pattern area of the recorded pattern (the direction orthogonal to the copying illumination light 11), the pattern area will be viewed in the same reconstruction color at the center and both ends.

Figure 4:
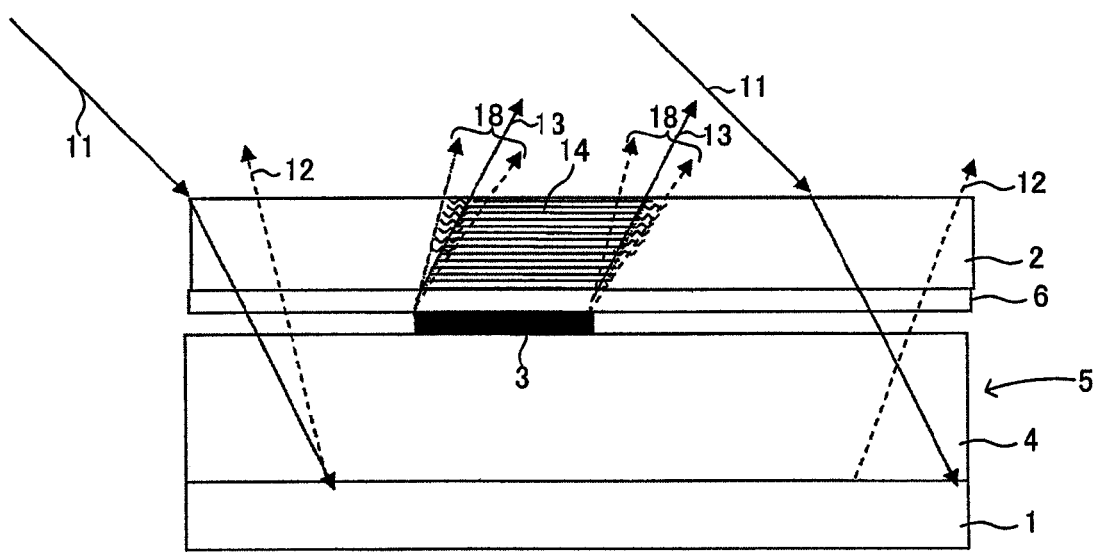
FIG. 4 is illustrative, as in FIG. 1, of a modification to the example of FIG. 1.

Now then, when the volume hologram master 1 is located as in FIG. 1 to copy a volume hologram similar to that master 1 in the volume hologram recording material 2, a cover film is often located on the surface of the volume hologram recording material 2 facing the volume hologram master 1 or the surface of the pattern plate 5 having the regular reflection pattern 3 formed on it. In such cases, there will be a spacing, the size of that cover film, left between the regular reflection pattern 3 and the volume hologram recording material 2, which will cause the influences of scattered light to appear from the edge of the regular reflection pattern 3, giving rise to a lowering of the resolving power of the reconstruction image of the pattern recorded. This is now explained with reference to FIG. 4. In this case, a cover film 6 is stacked on the surface of the volume hologram recording material 2 facing the volume hologram master 1. The pattern plate 5 is directed such that the regular reflection pattern 3 is in close contact with the cover film 6, and the volume hologram recording material 2, pattern plate 5 and volume hologram master 1 are closely stacked one upon another with or without an index-matching liquid held between them. In this state, copying illumination light 11 is allowed to be obliquely incident onto and transmit through the volume hologram recording material 2. A portion of the copying illumination light 11 passing through the regular reflection pattern 3-free transparent area of the pattern plate 5 enters through the volume hologram master 1 so that diffracted light 12 to reconstruct the recorded object image is produced on the incidence side of the copying illumination light 11. The diffracted light 12 passing through the transparent area of the pattern plate 5 and the incident copying illumination light 11 interfere together in the hologram recording material 2, forming hologram interference fringes in the volume hologram recording material 2, as is the case with FIG. 1. On the other hand, a portion of the copying illumination light 11 incident onto the reflection area where there is the regular reflection pattern 3 on the pattern plate 5 is reflected as regularly reflected light 13 that is in turn incident onto the volume hologram recording material 2 via the cover film 6, interfering with the copying illumination light 11 so that interference fringes 14 lined up parallel with the surface of the recording layer of the volume hologram recording material 2 are formed and superposed on the interference fringes that reconstruct the recorded object image in the volume hologram master 1. However, there is a distance, the size of the cover film 6, between the regular reflection pattern 3 and the volume hologram recording material 2, which causes scattered light 18 from the edge of the regular reflection pattern 3, too, to interfere with the copying illumination light 11, disturbing the interference fringes 14 near the edge. Accordingly, when, as shown in FIG. 2, white illumination light 21 is incident onto the volume hologram recording material 2 vertically from above, for instance, the delineations of the edges of the interference fringes 14 somewhat lack in clearness, giving rise to a lowering of the resolving power of the reconstructed image 15 (FIGS. 2 and 3) of the pattern to be recorded. In actual applications, however, this would virtually be negligible if the cover film 6 has a thickness of up to 500 μm.

With the microtext hologram fabricated by the aforesaid process, as explained with reference to FIGS. 2 and 3, the reconstructed image 15 in the micropattern made up of the interference fringes 14 is such that in the specific direction (the direction in the section including the copying illumination light 11 and the normal to the recording layer), the pattern portion is seen in a reconstruction color at both ends that is different from that at the center, and in the direction orthogonal to that specific direction, the whole pattern portion is seen in the same color. Thus, if the reconstructed image 15 in the micropattern recorded in the microtext hologram is read by means of a microscope or the like, it is then possible to judge whether that microtext hologram is genuine or bogus.

Here, instead of recording the interference fringes 14 by interference between the obliquely incident copying illumination light 11 and the obliquely, regularly reflected light 13, as shown in FIG. 1, it is also acceptable to record them by interference between copying illumination light that is vertically incident onto the volume hologram recording material 2 and vertically, regularly reflected light. In this case, the resolving power of the microtext hologram becomes higher than that obtained by the process of FIG. 1. An example of the fabrication process here is now explained with reference to FIGS. 5 to 8.

Figure 5:
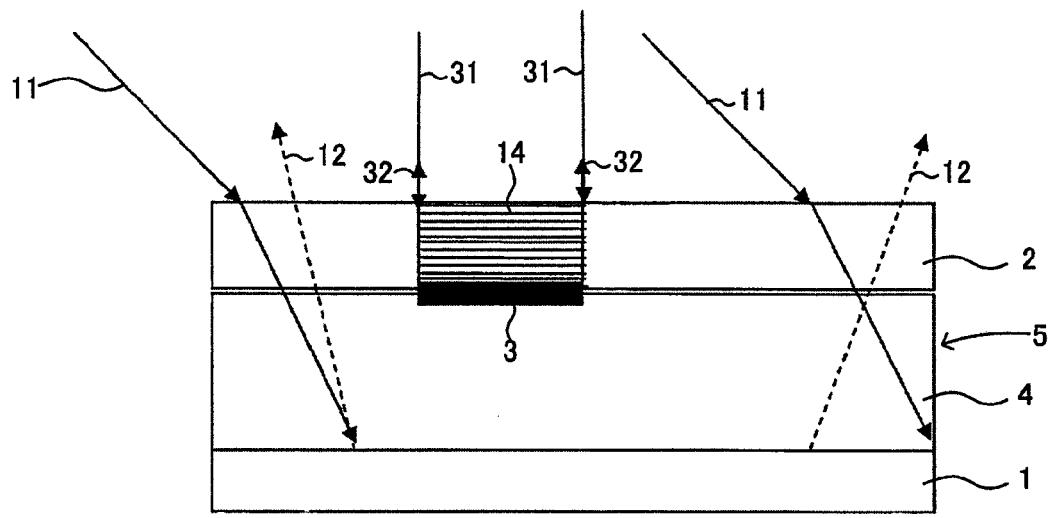
FIG. 5 is illustrative in section of another example of the inventive microtext hologram fabrication process.

The example of FIG. 5 is directed to multi-recording wherein the holographic copying of the volume hologram master 1 and the copying of the regular reflection pattern 3 as a hologram mirror are implemented using separate kinds of copying illumination light. As in FIG. 1, the volume hologram recording material 2, pattern plate 5 and volume hologram master 1 are closely stacked one upon another with or without a index-matching liquid held between them. For holographic copying of the volume hologram master 1, copying illumination light 11 is allowed to be obliquely incident onto and transmit through the volume hologram recording material 2, as in FIG. 1. A portion of the copying illumination light 11 passing through the regular reflection pattern 3-free transparent area of the pattern plate 5 enters through the volume hologram master 1 so that diffracted light 12 to reconstruct the recorded object image is produced on the incidence side of the copying illumination light 11. The diffracted light 12 passing through the transparent area of the pattern plate 5 and the incident copying illumination light 11 interfere together in the hologram recording material 2, forming in the volume hologram recording material 2 hologram interference fringes similar to those on the volume hologram master 1: the volume hologram master 1 is copied in the volume hologram recording material 2.

On the other hand, another copying illumination light 32 enters vertically from the same side as the copying illumination light 11 does, and simultaneously or back-to-back through the volume hologram recording material 2 onto the area of the pattern plate 5 having the regular reflection pattern 3 formed on it: it transmits through the volume hologram material 2, and is vertically reflected as regularly reflected light 32 at the regular reflection pattern 3 on the pattern plate 5 while that pattern configuration is kept intact. Then, that regularly reflected light 32 and the incident copying illumination light 31 interfere together in the volume hologram recording material 2 so that interference fringes 14 lined up parallel with the surface of the recording layer of the volume hologram recording material 2 are formed and superposed on the interference fringes that reconstruct the objected image recorded in the volume hologram master 1.

Figure 6:
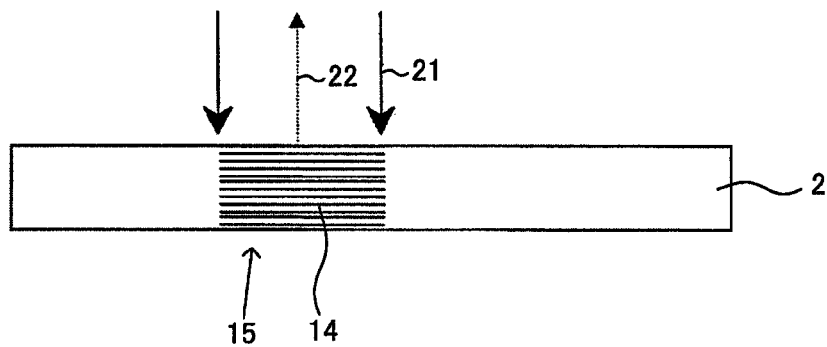
FIG. 6 is illustrative, as in FIG. 2, of FIG. 5.

With the interference fringes 14 recorded by this fabrication process, both the copying illumination light 31 and the regularly reflected light 32 are vertical to the recording surface. In other words, as shown in FIG. 6, they take on a rectangular shape in any section. For instance, when white illumination light 21 is incident onto the volume hologram recording material 2 vertically from above, light of a wavelength corresponding to the pitch of the interference fringes 14, for instance, light 22 of a green wavelength is reflected (diffracted) vertically up from the area having the interference fringes 14 recorded on it, that is, the area of the same shape as the regular reflection pattern 3 on the pattern plate 5. Accordingly, when the regular reflection pattern 3 is composed of visually unidentifiable microtexts or the like, a micropattern 15 composed of visually unidentifiable microtexts is readable by means of a microscope or the like from the copied volume hologram (volume hologram recording material 2) too. Thus, the copied hologram may be used in security applications. In the interference fringes 14 recorded by this fabrication process, there is none of such end areas 17 as shown in FIG. 2, and in the specific direction, both ends of the pattern portion are unlikely to be reconstructed in a reconstruction color different from that at the center: the whole area corresponding to the regular reflection pattern 3 is reconstructed in the same color.

Figure 7:
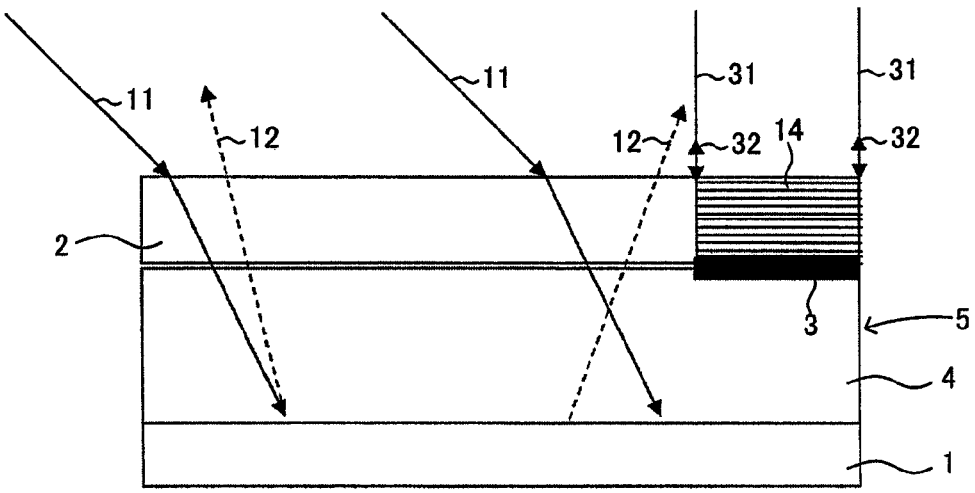
FIG. 7 is illustrative, as in FIG. 5, of a modification to the example of FIG. 5.

Although the example of FIG. 5 is directed to multi-recording where the holographic copying of the volume hologram master 1 and the copying of the regular reflection pattern 3 as a hologram mirror are implemented using separate kinds of copying illumination light, it is understood that on the volume hologram recording material 2, the area of copying the volume hologram master 1 may be separate from the area of copying the regular reflection pattern 3 as a hologram mirror, as exemplified in FIG. 7. On the same volume hologram recording material 2, an area of incidence of copying illumination light 11 for copying the volume hologram master 1 and diffracted light 12 from the volume hologram master 1 is separated from an area of incidence of copying illumination light 31 for copying the regular reflection pattern 3 on the pattern plate 5 and regularly reflected light 32 from it, so that a hologram copied from the volume hologram master 1 is recorded in the former area, and a hologram mirror for reconstructing a micropattern of the same shape as the regular reflection pattern 3 is recorded in the latter area.

Figure 8C:
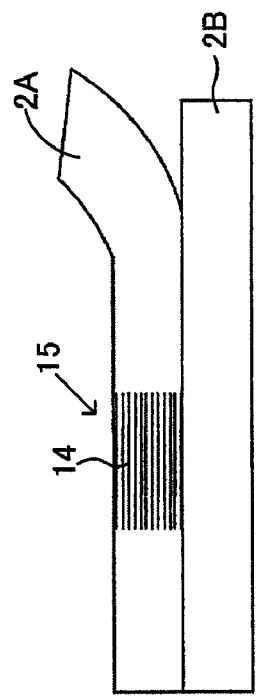
FIG. 8 is illustrative in section of yet another example of the inventive microtext hologram fabrication process.
Figure 8A:
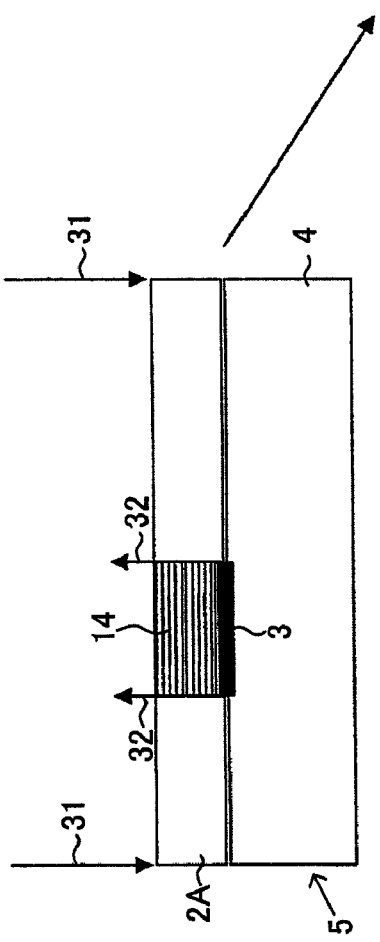

Alternatively, the hologram copied from the volume hologram master 1 and the hologram copied from the regular reflection pattern 3 on the pattern plate 5 may separately be fabricated, and thereafter they may be superposed one upon another, as exemplified in FIG. 8. In this case, two volume hologram recording materials 2A and 2B are used, and as shown in FIG. 8(*a*), one volume hologram recording material 2A is in close contact with the regular reflection pattern 3 on the pattern plate 5 with or without an index-matching liquid held between them. Then, copying illumination light 31 for copying the regular reflection pattern 3 on the pattern plate 5 is vertically incident onto the volume hologram recording material 2A, transmits through the volume hologram recording material 2A, and enters the reflection area where there is the regular reflection pattern 3 on the pattern plate 5. Then, the copying illumination light 31 is vertically reflected there as regularly reflected light 32 while the configuration of the regular reflection pattern 3 is kept intact, and the regularly reflected light 32 and the incident copying illumination light 31 interfere together in the volume hologram recording material 2A so that there is a hologram mirror recorded that reconstructs a micro-pattern of the same shape as the regular reflection pattern 3.

Figure 8B:
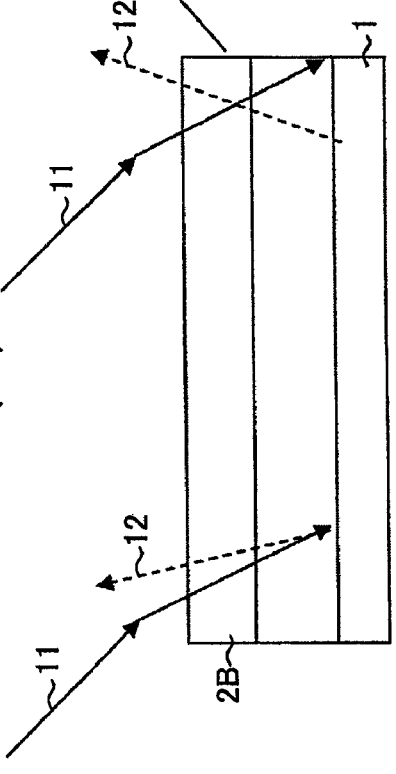

As shown in FIG. 8(b), another volume hologram recording material 2B is in close contact with the volume hologram master 1 with or without an index-matching liquid, a spacer or the like held between them. As in FIG. 1, the copying illumination light 11 is obliquely incident onto the volume hologram recording material 2B, transmits through the volume hologram recording material 2B, and enters the volume hologram master 1. There it is reflected to produce on the incident side diffracted light 12 that reconstructs the recorded object image, and the diffracted light 12 and the incident copying reflection light 11 interfere together in the volume hologram recording material 2B, so that a hologram is copied from the volume hologram master 1.

After that, as shown in FIG. 8(c), the volume hologram recording material 2A wherein the hologram in the micropattern of the same shape as the regular reflection pattern 3 is recorded and the volume hologram recording material 2B wherein the hologram copied from the volume hologram master 1 is recorded are integrally stacked together, thereby completing up a hologram having micro-text holograms for security purposes superposed one upon another.

Figure 9:
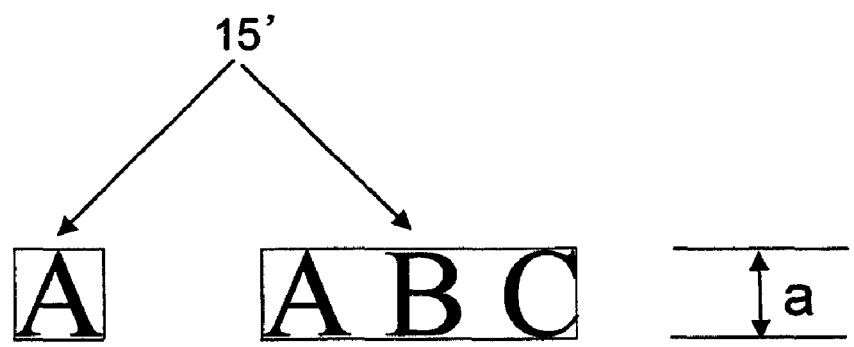
FIG. 9 is illustrative of the height of microtexts used as the micropattern recorded in the hologram according to the invention.

Here consideration is taken into the size of the pattern 15 that reconstructs visually unidentifiable microtexts or the like in the hologram fabricated by the aforesaid inventive fabrication processes. The pattern 15 is obtained by the holographic copying as a hologram mirror of the regular reflection pattern 3 on the pattern plate 5; however, even when the regular reflection pattern 3 on the pattern plate 5 is fabricated on the possible finest level by a photomask fabrication process or the like, it will eventually turn to a pattern 15 at the copying step, which is blurred to some extents. In actual applications, the size or diameter of one side of the pattern 15 reconstructed in the form of visually unidentifiable microtexts or the like will grow greater than 10 μm; however, it is possible to reduce that size to up to 50 μm, a figure being impossible with the prior art. As shown typically in FIG. 9, when the pattern 15 is composed of microtexts, the height a of a microtext area 15' can be adjusted to a range of 15 to 50 μm. When such microtexts are viewed on an enlarged scale through a simple magnifier such as a loupe, there is a size of barely about 0.5 to 1.0 mm obtained even given the height a of 50 μm, because such a magnifier has usually a magnification of 10 to 20 times: they are hard to find, providing a hologram suitable for use in security applications.

Figure 10:
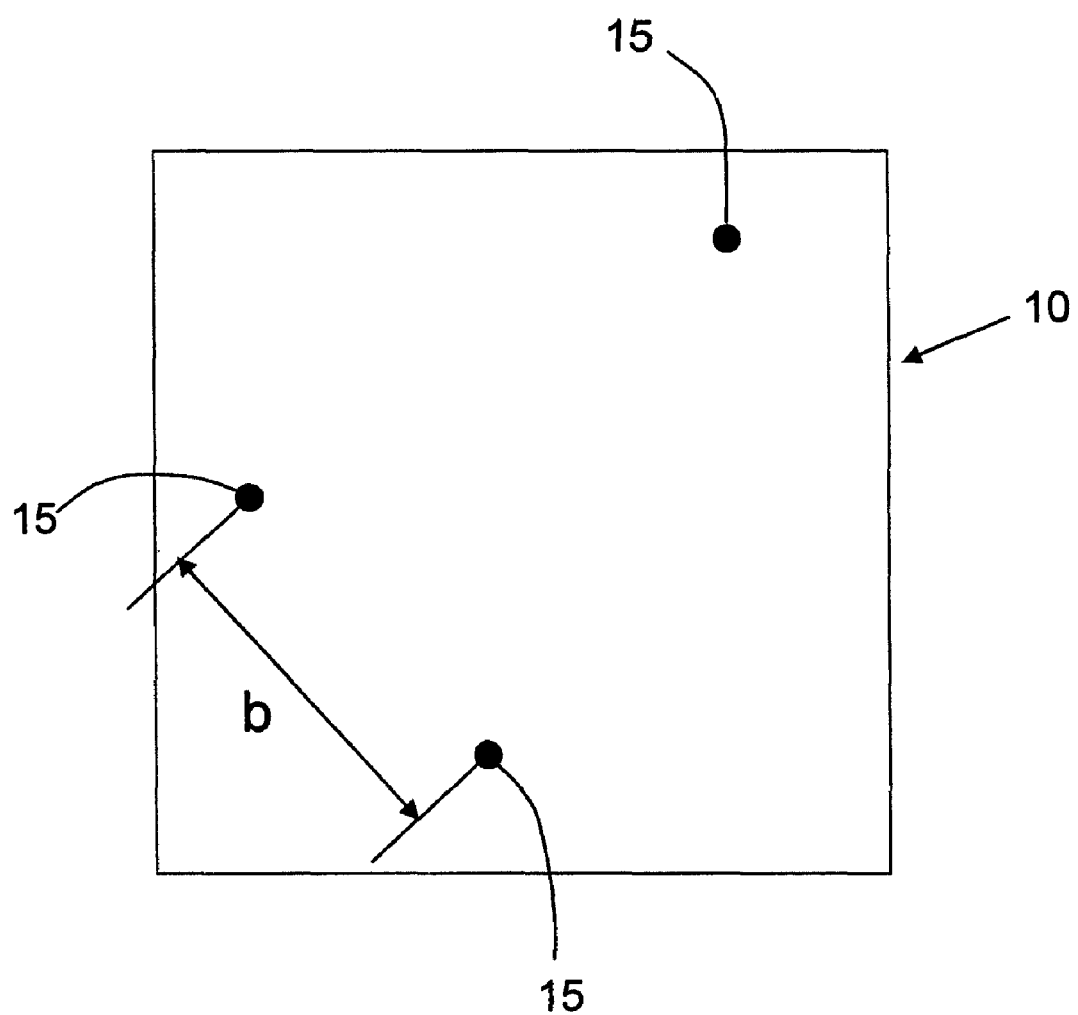
FIG. 10 is illustrative of how to record a micro-pattern in a plurality of areas of the hologram according to the invention.

When the hologram, in which the micropattern 15 such as a microtext pattern is recorded, is configured into such a hologram 10 as shown in FIG. 10, there can be occasions where the pattern 15 is recorded in only one site in the hologram 10, and cannot be viewed for the reason of flaws, stains or the like. Therefore, that pattern should be recorded in two or more sites, and preferably in three sites.

In that case, if the spacing b between the patterns 15 recorded in multiple sites is set at least 50 times as large as the size a of one side of the pattern 15, two patterns 15 are unlikely to be contained in the field of a microscope upon observation through it on an enlarged scale so that they can hardly be found, helping prevent the micropattern 15 such as a microtext pattern from being invisible under the influences of flaws or stains.

When the micropattern 15 such as a microtext pattern is recorded in the hologram 10 to use it in security applications, it is desirous to limit the area of recording the micropattern 15: if the area for the micro-pattern 15 is up to $1/10,000$, and preferably up to $1/20,000$ relative to the area of the hologram, it is then difficult to find such micropattern 15 for security purposes, resulting in more improved security capabilities.

While the inventive hologram fabrication processes and the fabricated holograms have been explained with reference to several examples, it is understood that the invention is never limited to them, and so various modification may be possible.

APPLICABILITY TO THE INDUSTRY

With the inventive hologram fabrication process and resulting hologram, direct holographic recording is achievable upon hologram copying without repeating the copying of the reflecting plate having a regular reflection zone over and over, so that without rendering resolving power worse, a visually unidentifiable microtext or other micropattern of the order of 10 μm is superposed on a holographically recorded image in a holographically recordable mode, yielding a hologram good enough for use in security applications. In the ensuing hologram, a hologram subject to color shifting at both ends of the pattern and an ordinary hologram are mixed up in a multiple or multilayer form: this feature contributes more to counterfeit resistance.

EXPLANATION OF THE REFERENCES

1: Volume hologram master,
2: Volume hologram recording material,
2A, 2B: Volume hologram recording materials,
3: Regular reflection pattern,
4: Transparent substrate,
5: Pattern plate,
6: Cover film,
10: Inventive hologram,
11: Copying illumination light,
12: Diffracted light,
13: Regularly reflected light,
14: Interference fringes,
15: Reconstructed image of the micropattern,
15': Microtext area,
16: Center area,
17: End areas,
18: Scattered light,
21: White illumination light,
22: Light of green wavelength (reflected light off the center area),
23: Orange light (reflected light off the end areas),
31: Another copying illumination light,
32: Regularly reflected light.

What is claimed is:

1. A hologram fabrication process wherein a volume hologram recording material is located on a side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a reflecting plate having a pattern of regular reflection zones is interleaved between said reflection type volume hologram master and said volume hologram recording material, and said copying illumination light incident onto said volume hologram recording material and regularly reflected light from the regular reflection zone of the said reflecting plate interfere together in said volume hologram recording material thereby allowing said regular reflection zone to be multi-recorded in a hologram having said reflection type volume hologram master copied in it, wherein the resultant volume hologram is a security hologram having an object image and a planar pattern formed therein, wherein said pattern comprises at least one microcharacter or security pattern.

2. A hologram fabrication process wherein a volume hologram recording material is located on a side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a reflecting plate having a pattern of regular reflection zones is interleaved between said reflection type volume hologram master and said volume hologram recording material, and another regular reflection zone copying illumination light is incident onto an area of said reflecting plate that has a regular reflection zone substantially vertically to said volume hologram recording material so that said regular reflection zone copying illumination light incident onto said volume hologram recording material and regularly reflected light from the regular reflection zone of said reflecting plate interfere together in said volume hologram recording material thereby allowing said regular reflection zone to be multi-recorded in a hologram having said reflection type volume hologram master copied in it, wherein the resultant volume hologram is a security hologram having an object image and a planar pattern formed therein, wherein said pattern comprises at least one microcharacter or security pattern.

3. A hologram fabrication process wherein a second volume hologram recording material is located on the side of a reflection type volume hologram master onto which a second copying illumination light is incident, and the second copying illumination light incident onto the second volume hologram recording material and light diffracted through the reflection type volume hologram master interfere together in the second volume hologram recording material thereby copying the reflection type volume hologram master, characterized in that:

the reflection type volume hologram master is formed using the process of claim 2.

4. A hologram fabrication apparatus wherein a volume hologram recording material is located on a side of a reflection type volume hologram master onto which copying illumination light is incident, and the copying illumination light incident onto the volume hologram recording material and light diffracted through the reflection type volume hologram master interfere together in the volume hologram recording material thereby copying the reflection type volume hologram master, characterized in that:

a reflecting plate having a pattern of regular reflection zones is interleaved between said reflection type volume hologram master and said volume hologram recording material, and said copying illumination light incident onto said volume hologram recording material and regularly reflected light from the regular reflection zone of the said reflecting plate interfere together in said volume hologram recording material thereby allowing said regular reflection zone to be multi-recorded in a hologram having said reflection type volume hologram master copied in it, wherein the resultant volume hologram is a security hologram having an object image and a planar pattern formed therein, wherein said pattern comprises at least one microcharacter or security pattern.

* * * * *